US008769460B1

(12) United States Patent
Hawkins et al.

(10) Patent No.: US 8,769,460 B1
(45) Date of Patent: Jul. 1, 2014

(54) DEVICE RECOGNITION ENGINE

(71) Applicant: Agilent Technologies, Inc., Loveland, CO (US)

(72) Inventors: Anne Marie Hawkins, Santa Rosa, CA (US); Ngangom Punmark Singh, Gurgaon (IN); Praveen V-S, Bangalore (IN)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 13/909,950

(22) Filed: Jun. 4, 2013

(51) Int. Cl.
 *G06F 9/455* (2006.01)
 *G06F 17/50* (2006.01)
(52) U.S. Cl.
 USPC ............ 716/112; 716/106; 716/107; 716/115
(58) Field of Classification Search
 CPC ............ G06F 17/5036; G06F 17/5031; G06F 17/505; G06F 17/5068; G06F 17/5072; G06F 17/5018
 USPC .................................. 716/106, 107, 112, 115
 See application file for complete search history.

(56) References Cited

U.S. PATENT DOCUMENTS

| 7,076,410 B1* | 7/2006 | Kerzman et al. ................... 703/6 |
| 7,644,377 B1* | 1/2010 | Saxe et al. ...................... 716/106 |
| 2005/0138595 A1* | 6/2005 | Khakzadi et al. ............... 716/18 |

* cited by examiner

*Primary Examiner* — Vuthe Siek
*Assistant Examiner* — Brian Ngo

(57) ABSTRACT

A method of operating a data processing system to extract instances of devices contained in a description of an integrated circuit and data processing systems implementing that method are disclosed. A device instance database includes a plurality of instances of devices contained in the integrated circuit, each device instance identifying corresponding structures in the integrated circuit that are part of the device instance. A device type definition library is used to search for instances of devices and includes a plurality of device type definitions, one of the type definitions defining a compound device includes two devices included in the device instance database. The data processing system searches the device instance database for compound devices defined in device type definition library, and updates the device instance database when a new device is found.

16 Claims, 5 Drawing Sheets

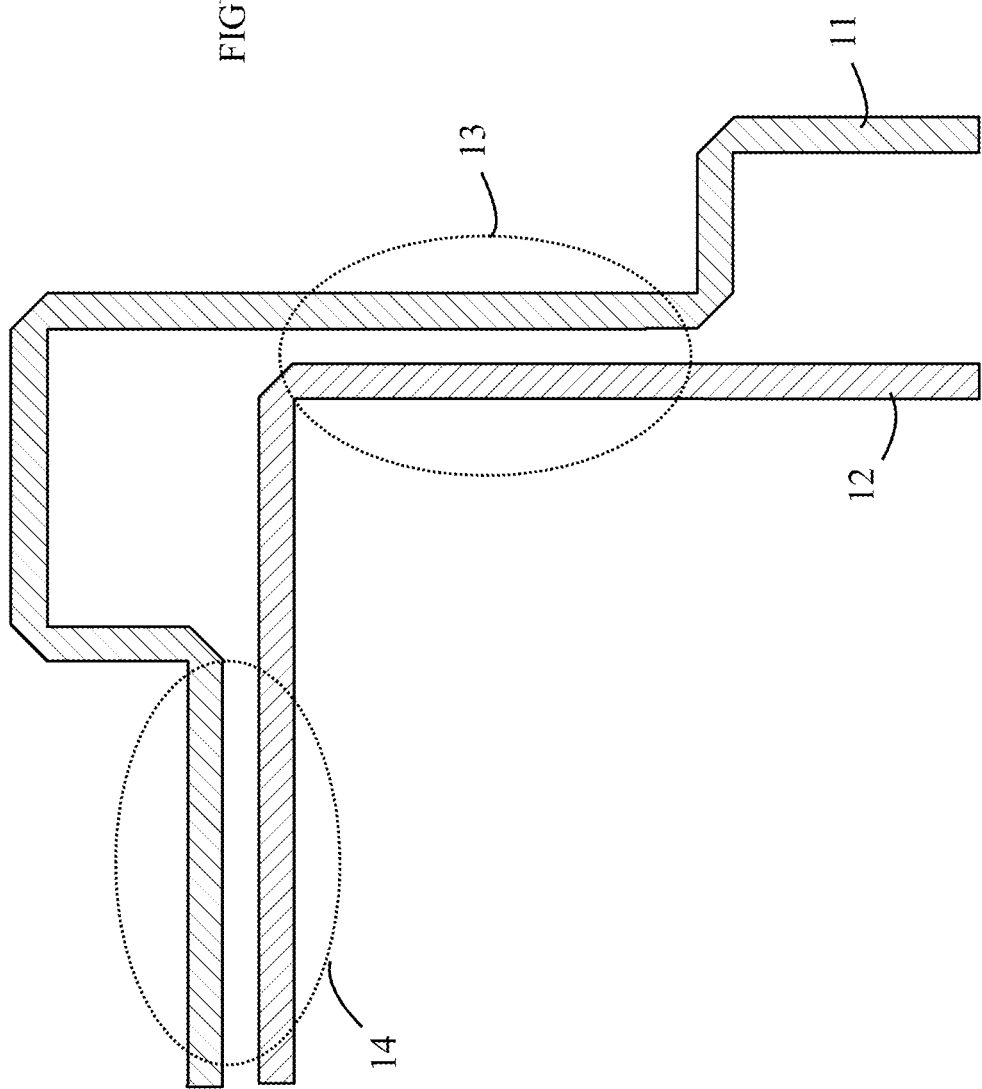

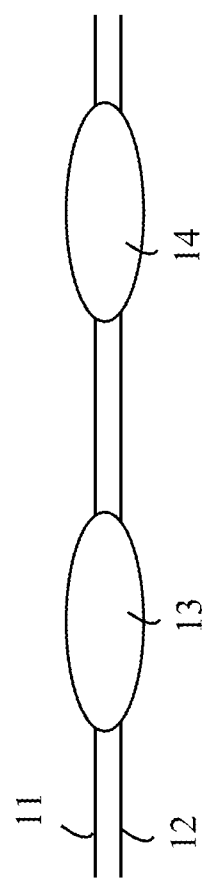
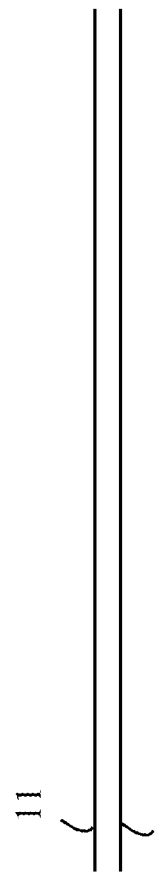

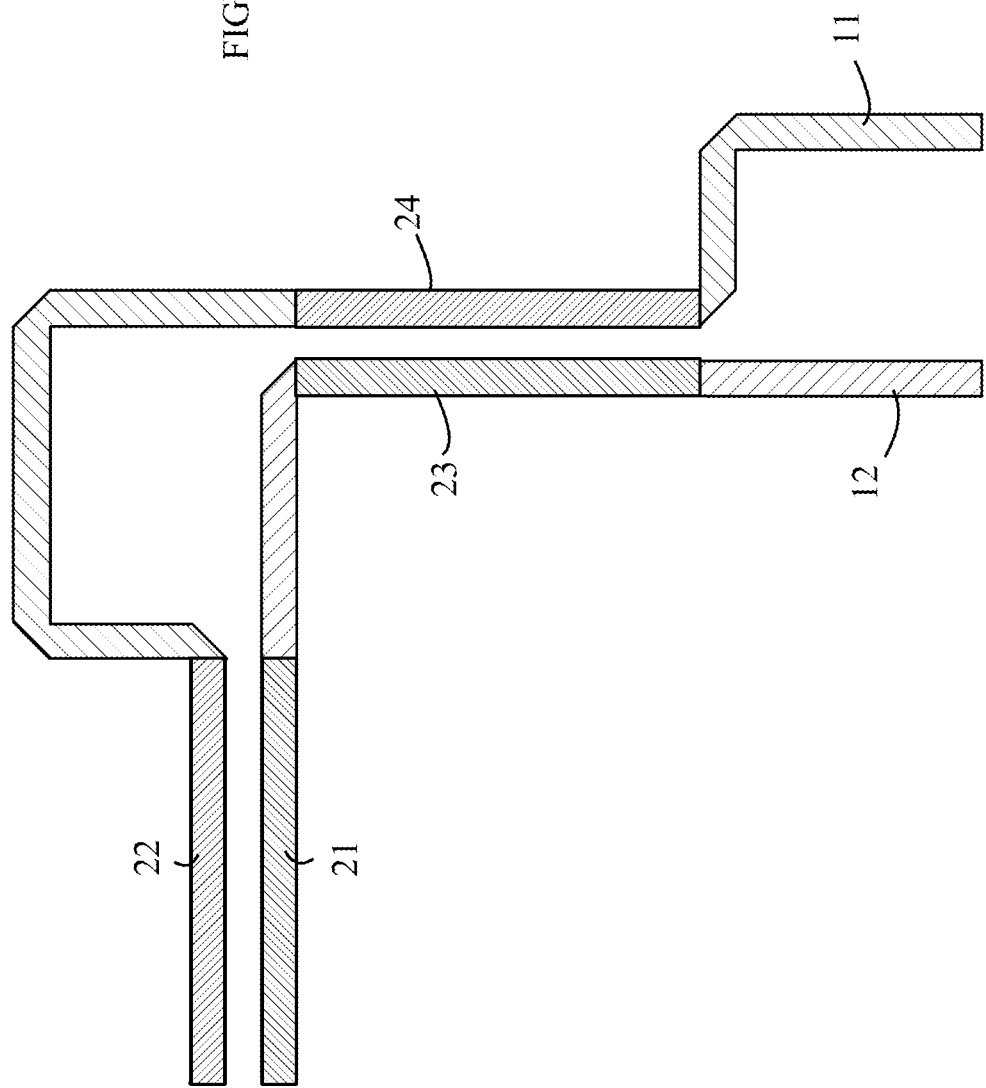

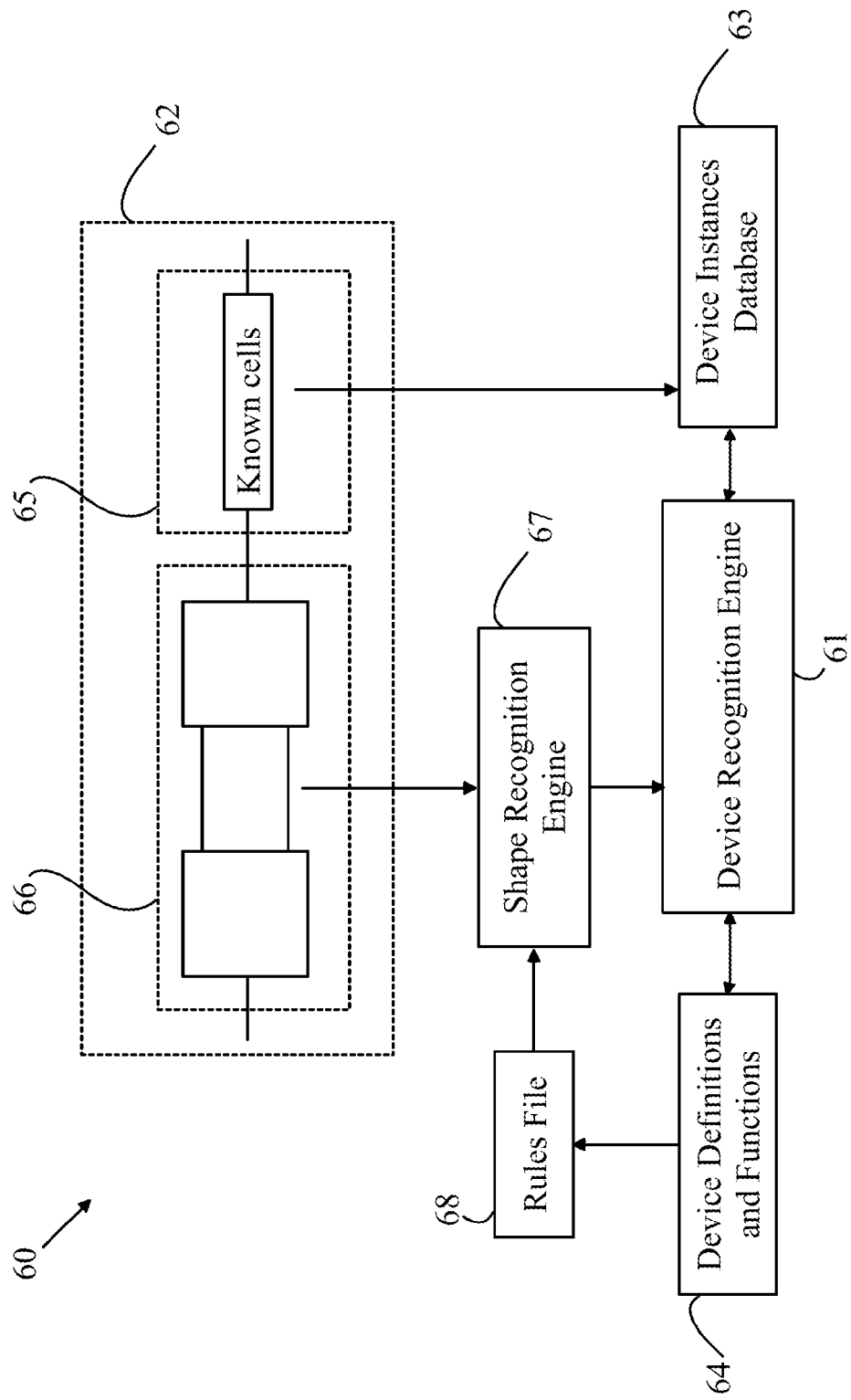

DEVICE RECOGNITION ENGINE

BACKGROUND OF THE INVENTION

Large integrated circuits (IC) are constructed from known cells that are connected together within the IC and custom structures that are defined in terms of artwork on various layers in the IC. In addition, the IC design can be divided into a plurality of different chips that are connected together using wire bonds or the like. Any given device within the IC can be viewed as having a set of artwork that defines structures, typically polygons, on the various layers of the IC or the individual chips. In general, a device also has electrical properties that are important in simulating the IC to determine if the final IC will work as intended. Known devices such as transistors are typically provided by the fabrication facility in a form that automatically generates the artwork for those device in the layout file that represents the IC. The known cells and remaining artwork for an IC are typically collected into a computer aided design file (CAD) which forms the input to various analysis tools that check the design to be sure that the design is consistent with the particular fabrication facility. These tools also check the design against the schematic of the circuit being implemented and generate other information on the layout of the device.

A typical large scale IC can have millions of devices. Correlating a device from the schematic with the corresponding artwork in a complex IC is a challenging task. Current tools do not provide a database that provides an easily accessible listing for each device in the IC that allows a designer to find a specific device and the artwork associated with that device.

In addition, the manner in which existing design and layout tools define devices is time consuming and error prone. A device is defined in a rule set in terms of the artwork associated with the device. If a device is a "compound device" that is constructed from a number of more elementary devices, the compound device must be specified as if the elementary devices do not exist. That is, the designer must specify the artwork for each of the elementary devices within the device definition of the compound device. In addition to increasing the complexity of device definition, this type of "flat" device definition obscures the true nature of the compound device.

In addition to the devices that are intentionally within the IC, there are "devices" that arise from the interactions of various structures in the ICs. For example, two conductors that are close to one another in one area of the IC may form a "device" that is a coupler between the two conductors. Finding such devices in an IC presents significant challenges using existing design tools.

SUMMARY OF THE INVENTION

The present invention includes a method of operating a data processing system to extract instances of devices contained in a description of an integrated circuit and data processing systems implementing that method. The method includes providing a device instance database, a device type definition library and causing the data processing system to instantiate devices defined in the device type definition library in the device instance library. The device instance database includes a plurality of instances of devices contained in the integrated circuit, each device instance identifying corresponding structures in the integrated circuit that are part of the device instance. The device type definition library includes a plurality of device type definitions, one of the device type definitions being a compound device definition that defines a compound device that includes two devices included in the device instance database. The data processing system searches the device instance database for compound devices defined in device type definition library, the data processing system updating the device instance database with a new instance of one of the devices defined in the device type definition library when a plurality of devices in the device instance database satisfy a corresponding one of the definitions in the device type definition library.

In one aspect of the invention, the data processing system iteratively updates the device instance database until no further compound device instances are found that are not already in the device instance database.

In another aspect of the invention, the description of the IC includes a predefined device that includes structures in the IC corresponding to that predefined device, and the data processing system updates the device instance database to include that predefined device prior to searching the device instance database for the compound devices.

In a still further aspect of the invention, the description of the IC includes a plurality of structures in the IC, and the data processing system searches the plurality of structures for devices that satisfy a shapes device definition that identifies a plurality of shapes that are parts of the structures. Each shapes device definition includes a plurality of shapes that must be part of an instance of a shapes device and a relationship between the shapes that must be satisfied. The data processing system adds a shapes device instance to the device instance database when the data processing system finds a plurality of shapes in the structures that satisfy a corresponding one of the shapes device definitions.

In another aspect of the invention, the data processing system generates a rules file that specifies relationships between the structures that would be required for the structures to include shapes corresponding to the candidate device. The rules file is in a format used by a semiconductor design rule checking system. In this aspect, causing the data processing system to generate the instance includes determining if one of the structures is included in a data file that includes information about a relationship between the structure and another structure in the structures library, the data file is generated by the semiconductor design rule checking system.

BRIEF DESCRIPTION OF THE DRAWINGS

FIG. 1 is a top view of a section of a metal layer having the two meandering conductors.

FIGS. 2A and 2B illustrate the circuit simulator modeling the circuit shown in FIG. 1.

FIG. 3 illustrates the shapes in each of the devices.

FIG. 5 is a block diagram of a system for generating a device library from a CAD database according to one embodiment of the present invention.

DETAILED DESCRIPTION OF THE PREFERRED EMBODIMENTS OF THE INVENTION

Figure 4:
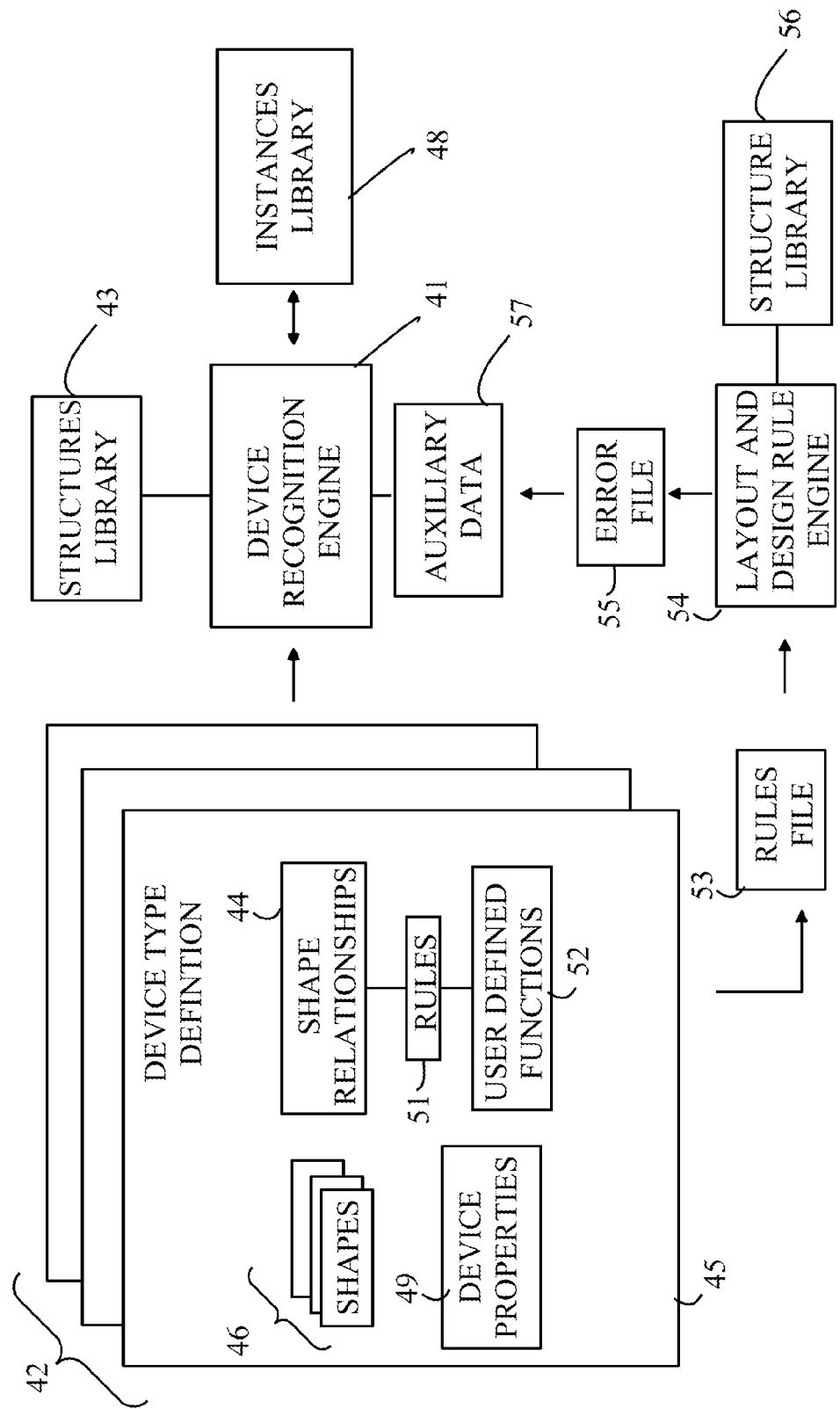
FIG. 4 illustrates the processing of a structures file to find all instances of each shapes device that is defined in a device type library.

The present invention digests the information in a CAD file to generate a database that includes each instance of each device type within the IC design defined by the CAD file. The device types that are instantiated are included in a library of device types that can include compound devices that are constructed from a number of elementary devices. The present invention automatically searches the device database in a recursive manner to find such compound devices.

The manner in which the present invention provides its advantages can be more easily understood with reference to FIG. 5, which is a block diagram of a system for generating a device library from a CAD database according to one embodiment of the present invention. System 60 includes a device recognition engine 61 that finds instances of devices that are incorporated in the IC described by CAD database 62. The devices are stored in device database 63. Each instance of a device includes the device type and the structural elements associated with that device. The devices can be viewed as consisting of three types of devices. The first type of device are the known cells 65 provided by the fabrication facility. The known cells exist in completed form in that the structural elements in the IC and the device type are already known. Hence, these devices are merely input to device database 63 in a form that is consistent with that used by the particular implementation of device database 63.

The second class of devices are defined by the structural elements 66 contained in the database. These structural elements typically include polygons associated with the various layers of the IC. It should be noted that a device may utilize only part of one the polygons. This class of device will be referred to as a "shapes" device, since the device is made up of one or more shapes that are included in the structural elements. For the purposes of the present discussion it is sufficient to note that a shapes device has a definition in a device definition library 64. Each definition defines the relevant shapes and the relationships between the shapes that must be satisfied for an instance of that device to be present. The manner in which the polygons are analyzed to find the shapes will be discussed in more detail below.

The third class of devices will be referred to as compound devices. A known device or a shapes device will be referred to as an elementary device in the following discussion. A compound device is a device that is made up of two or more devices that are already in device definition library 64. These devices may be elementary devices or other compound devices. Compound devices are also defined by device definitions in device definition library 64. Compound device instances are generated by device recognition engine 61. For each particular type of compound device, device recognition engine 61 searches the existing devices in device database 63 for instances of devices that satisfy the requirements of that compound device in device definition library 64. If two or more devices in device definition library 64 satisfy the limitations of the compound device being sought, a new instance of the compound device is proposed. If the proposed instance is not already in device definition library 64, the proposed instance is added to device definition library 64. This procedure is repeated for all compound device definitions until no new compound device instances are added to device definition library 64.

As noted above, one class of devices are devices that are constructed from parts of the structures in the structural elements portion of CAD database 62. The manner in which such devices are extracted from the structural elements can be more easily understood with reference to a simple device that will be referred to as a coupled conductor device. Consider two meandering conductors in a layer of metal in an IC. Refer now to FIG. 1, which is a top view of a section of a metal layer having the two meandering conductors. The two conductors are shown at 11 and 12. A circuit simulator that models the behavior of this simple circuit needs to account for cross-talk between sections of the conductors that lie close to one another as shown at 13 and 14. Referring to FIGS. 2A and 2B, the circuit simulator models the circuit shown in FIG. 1 as two conductors that are coupled by 13 and 14 rather than two ideal conductors as shown in FIG. 2B.

To model the circuit shown in FIG. 1 using the model of FIG. 2A, the circuit simulator must be able to identify two "devices" 13 and 14 that are part of the structures library that contains the polygons for conductors 11 and 12. The conventional device detecting algorithms have difficulty detecting such devices, as these device detecting algorithms require a plurality of shapes for each device in which one of the shapes is a key shape that is overlapped by the other shapes. In this case, both shapes in each device are on the same layer and there is no common shape that is overlapped.

Refer now to FIG. 3, which illustrates the shapes in each of the devices. These exemplary devices will be referred to as coupled conductors in the following discussion. Each coupled conductor consists of two rectangles that have edges that are parallel to one another and are separated by a distance that is less than some predetermined distance. Coupled conductor 13 consists of rectangles 23 and 24, and coupled conductor 14 consists of rectangles 21 and 22. It should be noted that each of these rectangles is part of one of the meandering traces shown in FIG. 1. Hence, the device recognition engine must be able to identify sub-shapes within larger shapes. In particular, the device recognition engine must examine each edge of the polygon that represents conductor 11 to determine if that edge is parallel to an edge of the corresponding polygon that represents conductor 12 and within the predetermined distance of the edge of conductor 12. When such a pair of edges is found, the device recognition engine must determine the distance over which the edges are parallel to define the length of each of the shapes that are to be part of an instance of the device in question.

In the present invention, an elementary shapes device is defined in terms of an object that has a specified set of shapes and two sets of methods. Each possible type of device is defined in a type definition that is analogous to an object type definition in an object oriented compiler language. The actual devices that are found in the structures file are instances of the corresponding device type. For example, the devices described above have a set of shapes consisting of two rectangles. In one aspect of the invention, the structures in the structures file are defined in terms of a coordinate system and the rectangles that are part of the shapes device are likewise defined in terms of that coordinate system in a manner that allows a user to see the specific parts of the structures file that correspond to a given instance of a device.

The first set of methods defines the relationships between the shapes that must be satisfied for the shapes to be part of the shapes device. In this sense, a shapes device type definition differs from a conventional object definition of the type used in object oriented compiler languages, which merely requires that the data be present. The methods of this set allow a device recognition engine according to the present invention to determine if a structure, or part thereof, could be part of a particular shapes device type. These methods will be referred to as the device recognition methods in the following discussion. In the above-described example, the coupled conductor definition includes a method that determines if two given structures include two parallel rectangles that have edges less than a predetermined maximum separation. If this condition is satisfied, a method in this set returns the coordinates of each of the rectangles in question. The device recognition engine can then generate an instance of the coupled conductor device.

The second set of methods generates the properties of the instance of a device of the type in question when the methods are executed. This set of methods is common to all types of devices. These properties include the locations of each of the shapes that makeup the instance of the device and, optionally, one or more other properties of the instance of the device such as the electrical properties of that instance. It should be noted that while a compound device may not explicitly include a set of shapes, the elementary devices from which it is constructed will include such shapes from the corresponding structures in the IC. Hence, with reference to the above example, the object definition defines a coupled conductor device as consisting of two rectangles having parallel edges within a predetermined distance of each other. Instances of these objects include the positions and sizes of the rectangles. The electrical properties of the instances are computed from the shapes and can include, for example, a coupling constant as a function of frequency.

The problem of finding all devices that satisfy the conditions of a shapes device presents challenges in a CAD database having millions of structures. For many applications of interest the device recognition methods define the shapes in terms of relationships between two or more shapes that are parts of structures in a structures library. This case is commonly encountered in IC layouts and verification tool environments. In the coupled conductor example discussed above, the shapes were two parallel rectangles whose edges were closer than some predetermined distance. While the conventional device recognition engines used in layout verification cannot easily recognize a device that does not satisfy the limitation of consisting of overlapping shapes, such engines and the languages used in the verification rules can be useful as preprocessing engines for the device recognition engine of the present invention or as a syntax for use in constructing the device recognition methods.

The conventional rules checking engines used to verify that the structures in the CAD library do not violate the fabrication facilities design rules can be used to pre-process the structures library to identify structures that may include the shapes needed for a particular shapes device. In general, these rule checking engines take a rules file and a structures library and generate an error file listing design errors in terms of structures that violate the rules in the rules file. The rule checking engines are optimized for large structure libraries. Hence, if conditions that must be satisfied to be part of a shapes device can be written into a set of rules for a rule checking engine such that a structure that could be part of the shapes device in question would violate one of the rules, the conventional rule checking engines can be used as a preprocessor to reduce the work that the device recognition engine of the present invention must perform in identifying a shapes device. Even if the shapes in question cannot be completely identified with a conventional rule set, the conventional rule set can reduce the work that must be done by the device recognition engine of the present invention.

In the coupled conductor example discussed above, the first part of the device recognition method could be a rule that identifies all structures that have an edge that is parallel to an edge of a second structure in which the two edges are closer than a predetermined distance. Conventional layout tools regularly test for such conditions to avoid layouts that have structures that are too close to guarantee that the structures will not touch when built to the tolerance available in the fabrication system. Hence, if the relationship methods that define the relationship between the devices can be divided into a first part that consists of a set of rules for a rule checking engine and a second part that operates on the structures identified by the rule checking engine, the workload can be significantly reduced. For example, the device recognition engine of the present invention need only consider structures that have edges that are closer than the predetermined distance in question. Given two structures that are identified as satisfying this condition, the second part of the device recognition methods need only extract the rectangles that are defined by the parallel edges in question.

Refer again to FIG. 5. In one aspect of the invention, the device definition library generates a rules file 68 in a format that is compatible with the shape recognition engine 67 of a conventional design rule checking program. The design rule checking program generates an output error file that identifies all structures in the structural elements 66 that violate the rules. This error file is then used by device recognition engine 61 in reducing the workload required to examine the structures to find instances of the shapes devices in question.

This aspect of the present invention is shown in more detail in FIG. 4, which illustrates the processing of a structures file to find all instances of each shapes device that is defined in a device type library. A device recognition engine 41 accesses a device type library 42 that defines the types of devices that are to be found in a structures library 43. As noted above, each device type definition includes one or more methods 45 that define the relationship between the shapes 46 that belong to the device. These methods will be referred to as the device recognition methods in the following discussion and are shown symbolically at 44 in the device definition for methods 45. (or device type library 42?)

Device recognition engine 41 goes through the device type definitions in device type library 42 in a predetermined order when processing structures library 43. The order may be specified in an optional input data file or be defined in device type library 42. For example, device recognition engine 41 could merely process the device type definitions in the order the device type definitions are stored in the data processing system on which device recognition engine 41 is being executed.

Given a current device type that is being sought, device recognition engine 41 goes through the structures in structures library 43 one at a time and tests each structure with the device recognition methods for that device type. In one aspect of the invention, if the device recognition methods indicate that the structure concludes a shape that could be used as one of the data shapes for a device of the type in question, the device recognition methods extract the shape in question and enter it into a temporary instance of the device in question. If this shape is the first shape to be found for this instance, a new temporary instance is created. If this shape completes the instance of the device, the device recognition methods set a flag to inform the device recognition engine that the instance is now complete. Completed instances are then transferred to an instances library 48. When all of the structures in structures library 43 have been processed, device recognition engine 41 moves to the next device type definition in device type library 42.

There is a tradeoff between finding all possible devices and creating duplicate devices. By sequentially processing the structures in structures library 43 for each device type, duplicate devices are avoided. However, devices in which the same shape is part of two different devices can be lost. In addition, a structure in structures library 43 may include multiple shapes with one shape being part of a first instance of the device in question and the second shape being part of another instance. The coupled conductor devices discussed above illustrate this situation. Each structure has two rectangles that are used in two different devices.

These potentially lost instances can be captured using other, more computationally intensive, algorithms for processing the structures. For example, each time a new instance of a device is started, device recognition engine 41 goes through the structures from beginning to end. Consider the case in which a structure has a shape that satisfies the requirements for a first shape in the shape in the instance being constructed. This shape in the shape definitions of the device type will be referred to as shape1. The identified shape is characterized by a set of coordinates in the structures library coordinate system. The shape is then compared to the shape1 entries in each of the completed instances for devices of this type that are in instances library 48 to determine if the coordinates match a shape1 entry that has already been defined. If a shape is found as a shape1 entry in one of the completed instances, the shape is rejected and the next shape is explored. If the shape is not found as a shape1 shape in the completed instances, it becomes the shape1 shape in the current instance. Device recognition engine 41 can provide the methods that search the instances library, or the device recognition methods of the device type being sought can provide this function. To facilitate the identification of duplicates in this manner, the device properties methods 49 include methods that return the coordinates associated with each of the shapes in an instance of that device.

In many cases, the device recognition methods can be broken into two parts. The first part defines relationships between structures in the structures library that must be satisfied and in which the relationships can be written in terms of rules 51 in the syntax used in a conventional layout and verification tool set. In many cases of interest, these rules will be insufficient to determine if a structure contains a shape of interest; however, structures that are identified by these rules are candidates that should be examined further to see if the structures contain the required shapes. The task of checking a structure identified by the rules is then performed by the second part of the device recognition methods. The methods 52 in the second part will often be written in terms of user defined functions in a conventional object-oriented programming language.

In the coupled conductor example discussed above, the first part of the device recognition method could be a rule that identifies all structures that have an edge that is parallel to an edge of a second structure in which the two edges are closer than a predetermined distance. Conventional layout tools regularly test for such conditions to avoid layouts that have structures that are too close to guarantee that the structures will not touch when built to the tolerance available in the fabrication system. Given two structures that are identified as satisfying this condition, the second part of the device recognition methods must extract the rectangles that are defined by the parallel edges in question.

Using the layout and verification tool syntax for the first part of the device recognition method has two advantages. First this syntax is well defined and published as part of such tools. Programmers who have expertise in writing rule sets already exist. Second, the rules for each of the device types can be output to a rules file that is then run on such a layout tool with the structure library in question. Conventional layout analysis tools operating on a structures library can be programmed to output an error message if some defined relationship between the structures in the library is detected. Such engines check for violations of the design rules for the fabrication system in question by the IC defined in the structures library. The designer inputs the design rules in the form of a set of rules that must not be violated. When a violation is found, the identity of the rule that was violated and the shapes that caused the violation is output in an error file that can be read by other programs.

For example, these prior art layout engines can be programmed to output an error if two edges of any polygons are within a predetermined distance of one another. The error output from this rule can be used to determine if a structure currently being examined by device recognition engine 41 could include a shape that is needed for the device instance currently being constructed. If the structure is not listed in the error output, the structure could not have a shape that is needed to construct a coupled conductor device of the type discussed above. Hence, the layout tools can be used as a preprocessor for the device recognition engine of the present invention if part of the device recognition methods can be translated into design rules that generate errors when the layout tool checks the structures library using the design rules.

In one aspect of the invention, each device type includes a method that causes any layout checking rules included in that device type to be output to a rules file 53. The method can merely copy rules written in the layout tool syntax or actually translate rules in a different syntax to those rules. The device recognition engine causes each type in the library to output that type's rules to the rules file. In one aspect of the invention, the rules include tags that associate the rules with specific device types. The completed rules file is then run on a conventional layout tool 54 using a copy of the structures library as shown at 56. The resultant error file 55 is then used to generate an auxiliary data file 57 that provides an additional input to the device recognition engine of the present invention as shown at 57. When device recognition engine 41 selects a structure from the structures library in an attempt to find an instance of the device in question, the device recognition engine first checks to see if the selected structure is associated with an error message having a tag that identifies the device type in question. If the shape does not have such a message, the device recognition engine proceeds to the next structure in the library. If the structure does have such an error message, the device recognition engine calls the corresponding method in the type definition to determine if the shape being sought is part of the structure in question.

The device recognition engine of the present invention can be run as a separate tool to provide the instances library of devices or as part of a more extensive program such as a layout and design rule checking program. When run as part of a design rule and layout program, the present invention can provide additional device identification features that would not otherwise be available to such programs. The device recognition engine of the present invention can be run on a general purpose data processing system having a central processing unit and graphical user interface or on special purpose hardware.

It should be noted that an IC description in a CAD or similar database can include a number of chips that are connected by structures such as bond wires. The individual chips and bond wires can be viewed as separate devices by the present invention when constructing compound devices. For example, a compound device consisting of a first chip and a second chip in which the two chips are connected by a bond wire could be defined as a type of compound device. Such compound device recognition is useful in modeling larger systems.

The system of the present invention can be implemented on a general purpose data processing system or in specialized computing hardware. The resultant device instance database can be accessed through that data processing system or a separate data processing system using an appropriate application interface. In this aspect of the invention, the database becomes a description for the IC that can be used by other design and simulation tools.

The present invention also includes a computer readable medium that stores instructions that cause a data processing system to execute the method of the present invention. A computer readable medium is defined to be any medium that constitutes patentable subject matter under 35 U.S.C. 101. Examples of such media include non-transitory media such as computer memory devices that store information in a format that is readable by a computer or data processing system.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A method of operating a data processing system to extract instances of devices contained in a description of an IC, said method comprising:
   providing a device instance database, said device instance database comprising a plurality of instances of devices contained in said IC, each device instance identifying corresponding structures in said description of the IC that are part of said device instance;
   providing a device type definition library comprising a plurality of device type definitions, one of said device type definitions being a compound device definition that defines a compound device comprising two devices included in said device instance database;
   wherein said compound device definition includes a relationship between said two devices in said device instance database that must be satisfied by said two devices; and
   causing said data processing system to search said device instance database for compound devices defined in said device type definition library, said data processing system updating said device instance database with a new instance of one of said devices defined in said device type definition library when a plurality of devices in said device instance database satisfy a corresponding one of said device type definitions in said device type definition library.

2. The method of claim 1 wherein said data processing system iteratively updates said device instance database until no further compound device instances are found that are not already in said device instance database.

3. The method of claim 1 wherein said description of said IC comprises a predefined device that includes a plurality of structures in said description of said IC corresponding to that predefined device and wherein said data processing system updates said device instance database to include that predefined device prior to searching said device instance database for said compound devices.

4. The method of claim 1 wherein said description of said IC comprises a plurality of structures in said IC and wherein said data processing system searches a structures library defining said plurality of structures for devices that satisfy a shapes device definition that identifies a plurality of shapes that are parts of said structures, each shapes device definition including a plurality of shapes that must be part of an instance of a shapes device and a relationship between said shapes that must be satisfied.

5. The method of claim 4 wherein said data processing system adds a shapes device instance to said device instance database when said data processing system finds a plurality of shapes in said structures that satisfy said shapes device definition.

6. The method of claim 4 comprising generating a rules file that specifies relationships between said structures that would be required for said structures to include shapes corresponding to said plurality of shapes.

7. The method of claim 4 wherein said rules file is in a format used by a semiconductor design rule checking system, and wherein causing said data processing system to generate said instance comprises determining if one of said structures is included in a data file that includes information about a relationship between said one of said structures and another one of said structures in said structures library, said data file being generated by said semiconductor design rule checking system.

8. The method of claim 7 wherein said data file is an error file listing design errors detected by said semiconductor design rule checking system.

9. A non-transitory computer readable medium comprising instructions that cause a data processing system to execute a method for operating a display screen that is part of said data processing system, said method comprising:
   providing a device instance database, said device instance database comprising a plurality of instances of devices contained in said IC, each device instance identifying corresponding structures in said description of the IC that are part of said device instance;
   providing a device type definition library comprising a plurality of device type definitions, one of said device type definitions being a compound device definition that defines a compound device comprising two devices included in said device instance database;
   wherein said compound device definition includes a relationship between said two devices in said device instance database that must be satisfied by said two devices; and
   causing said data processing system to search said device instance database for compound devices defined in said device type definition library, said data processing system updating said device instance database with a new instance of one of said devices defined in said device type definition library when a plurality of devices in said device instance database satisfy a corresponding one of said device type definitions in said device type definition library.

10. The computer readable medium of claim 9 wherein said data processing system iteratively updates said device instance database until no further compound device instances are found that are not already in said device instance database.

11. The computer readable medium of claim 9 wherein said description of said IC comprises a predefined device that includes a plurality of structures in said description of said IC corresponding to that predefined device and wherein said data processing system updates said device instance database to include that predefined device prior to searching said device instance database for said compound devices.

12. The computer readable medium of claim 9 wherein said description of said IC comprises a plurality of structures in said IC and wherein said data processing system searches a structures library defining said plurality of structures for devices that satisfy a shapes device definition that identifies a plurality of shapes that are parts of said structures, each shapes device definition including a plurality of shapes that must be part of an instance of a shapes device and a relationship between said shapes that must be satisfied.

13. The computer readable medium of claim 12 wherein said data processing system adds a shapes device instance to said device instance database when said data processing system finds a plurality of shapes in said structures that satisfy said shapes device definition.

14. The computer readable medium of claim 12 comprising generating a rules file that specifies relationships between said structures that would be required for said structures to include shapes corresponding to said plurality of shapes.

15. The computer readable medium of claim 12 wherein said rules file is in a format used by a semiconductor design rule checking system, and wherein causing said data processing system to generate said instance comprises determining if one of said structures is included in a data file that includes information about a relationship between said one of said structures and another one of said structures in said structures library, said data file being generated by said semiconductor design rule checking system.

16. The computer readable medium of claim 15 wherein said data file is an error file listing design errors detected by said semiconductor design rule checking system.

* * * * *